(12) United States Patent
Ishihara

(10) Patent No.: US 11,451,050 B2
(45) Date of Patent: Sep. 20, 2022

(54) CHROMATOGRAPH APPARATUS AND LOAD SWITCH CIRCUIT

(71) Applicant: SHIMADZU CORPORATION, Kyoto (JP)

(72) Inventor: Yugo Ishihara, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 480 days.

(21) Appl. No.: 16/725,322

(22) Filed: Dec. 23, 2019

(65) Prior Publication Data

US 2020/0227911 A1    Jul. 16, 2020

(30) Foreign Application Priority Data

Jan. 16, 2019  (JP) .............................. JP2019-005584

(51) Int. Cl.
| | | |
|---|---|---|
| *H02H 9/00* | (2006.01) | |
| *H03K 17/16* | (2006.01) | |
| *H05B 41/36* | (2006.01) | |
| *G01N 30/02* | (2006.01) | |

(52) U.S. Cl.
CPC ............. *H02H 9/001* (2013.01); *H03K 17/16* (2013.01); *G01N 30/02* (2013.01); *H05B 41/36* (2013.01)

(58) Field of Classification Search
CPC ........ H02H 9/001; H02H 9/002; H03K 17/16; H03K 17/163; H05B 41/36
USPC ................ 250/208.4; 327/439, 519, 520, 574
See application file for complete search history.

(56) References Cited

U.S. PATENT DOCUMENTS

| | | | |
|---|---|---|---|
| 7,800,878 B2 * | 9/2010 | Komatsu ................. | H02M 1/32 |
| | | | 361/84 |
| 2011/0193414 A1 * | 8/2011 | Furuichi ................. | H02J 9/005 |
| | | | 307/99 |
| 2018/0062517 A1 * | 3/2018 | Cheng ..................... | H02H 9/004 |

FOREIGN PATENT DOCUMENTS

| | | |
|---|---|---|
| JP | 2016-32190 A | 3/2016 |
| WO | 2013/140617 A1 | 9/2013 |

OTHER PUBLICATIONS

Office Action for corresponding JP Application No. 2019-005584 dated Jun. 8, 2022, with English language machine translation.

* cited by examiner

*Primary Examiner* — William Hernandez
(74) *Attorney, Agent, or Firm* — Renner, Otto, Boisselle & Sklar, LLP

(57) ABSTRACT

A load switch circuit for turning on and off supply of DC power to a load circuit of a chromatograph apparatus, the load switch circuit comprising: a first switching element connected to between a first node that receives DC voltage and the load circuit, the first switching element including a control terminal that receives a potential of a second node; a capacitive element connected to between the first and second nodes; a first resistive element connected to between the first and second nodes; and a bypass circuit configured to pass current between the first and second nodes upon turn-off of the first switching element.

10 Claims, 8 Drawing Sheets

CHROMATOGRAPH APPARATUS AND LOAD SWITCH CIRCUIT

BACKGROUND OF THE INVENTION

1. Technical Field

The present invention relates to a chromatograph apparatus and a load switch circuit.

2. Background Art

A detector such as an absorbance detector is used for a chromatograph such as a liquid chromatograph (for example, Patent Document 1 (WO2013/140617)). A detector used for a liquid chromatograph is provided with a light source such as a deuterium lamp, a motor that drives a shutter, a heater that adjusts the temperature of an optical system, and the like. A circuit that lights the light source, a circuit that drives the motor, a circuit that drives the heater, and the like are load circuits to which DC power is supplied from a common power supply circuit. A load switch circuit is used to turn on and off the supply of DC power from the power supply circuit to the load circuit. For example, a field-effect transistor is used for the load switch circuit.

If the load circuit includes a capacitive component of, for example, a capacitor, the inrush current flows into the capacitive component of the load circuit when the field-effect transistor is turned on at high speed. A capacitor having a relatively large time constant may be connected to the load switch circuit to reduce the inrush current. Consequently, the speed to turn on the field-effect transistor is reduced. As a result, the peak current that flows through the field-effect transistor when the field-effect transistor is turned on can be reduced.

On the other hand, if a capacitor having a relatively large time constant is provided to the load switch circuit, the turn-off time of the field-effect transistor is increased. If the field-effect transistor attempts to turn itself off in a state where a large current is being supplied to the load circuit, the drain-source voltage is generated to temporarily increase the heat generation of the field-effect transistor. If the turn-off time is increased, the amount of heat generated is increased. Accordingly, the need for using a field-effect transistor having large rated current capacity arises. Consequently, the component cost increases.

SUMMARY OF THE INVENTION

An object of the present invention is to provide a chromatograph apparatus and a load switch circuit that can reduce inrush current and reduce the heat generation of a component at low cost.

A chromatograph apparatus comprises: a plurality of operating sections configuring a chromatograph; and a load switch circuit configured to turn on and off supply of DC power. At least one of the plurality of operating sections is connected as a load circuit to the load switch circuit, and the load switch circuit includes a first switching element connected to between a first node that receives DC voltage and the load circuit, the first switching element having a control terminal that receives a potential of a second node, a capacitive element connected to between the first and second nodes, a first resistive element connected to between the first and second nodes, and a bypass circuit configured to pass current between the first and second nodes upon turn-off of the first switching element.

It becomes possible to reduce inrush current and reduce the heat generation of a component at low cost in a chromatograph apparatus.

The bypass circuit includes a one-way continuity circuit configured to pass current from the first node to the second node upon the turn-off of the first switching element.

The load switch circuit further includes a second resistive element connected to between the second node and a third node, and the one-way continuity circuit includes a third resistive element connected to between the first and third nodes, and a diode connected to between the third and second nodes.

The load switch circuit further includes a second switching element connected to between the third node and a fourth node set at a reference potential, and a fourth resistive element connected to between an anode of the diode and the second node.

The chromatograph includes an analytical column, a detector configured to detect constituents of a sample separated by the analytical column, and a power supply circuit, the detector includes the load switch circuit and the load circuit, and the load switch circuit is connected to between the power supply circuit and the load circuit.

The load circuit includes a lamp lighting circuit, a motor driving circuit, or a heater driving circuit.

A load switch circuit for turning on and off supply of DC power to a load circuit of a chromatograph apparatus, the load switch circuit comprising: a first switching element connected to between a first node that receives DC voltage and the load circuit, the first switching element including a control terminal that receives a potential of a second node; a capacitive element connected to between the first and second nodes; a first resistive element connected to between the first and second nodes; and a bypass circuit configured to pass current between the first and second nodes upon turn-off of the first switching element.

It becomes possible to reduce inrush current and reduce the heat generation of a component at low cost in a load switch circuit.

DETAILED DESCRIPTION OF THE EXEMPLARY EMBODIMENTS

Hereinafter, a chromatograph apparatus and a load switch circuit used by the chromatograph apparatus according to an embodiment are described in detail with reference to the drawings.

(1) Configuration of Chromatography Detector

Figure 1:
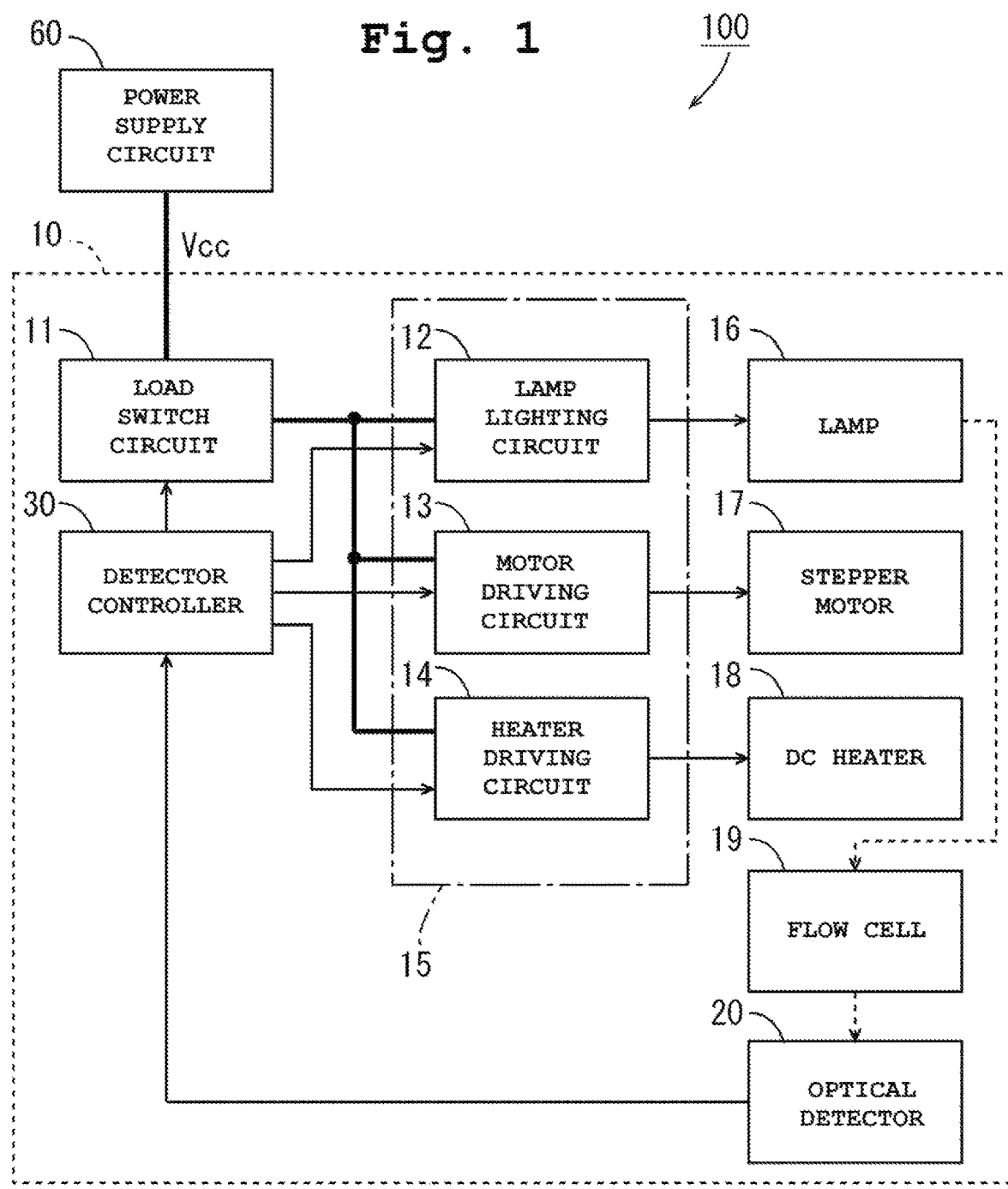
FIG. 1 is a block diagram mainly illustrating the configuration of a chromatography detector in a chromatograph apparatus according to an embodiment.

FIG. 1 is a block diagram mainly illustrating the configuration of a chromatography detector in a chromatograph apparatus according to an embodiment.

As illustrated in FIG. 1, a chromatograph apparatus 100 includes a chromatography detector 10 and a power supply circuit 60. The chromatography detector 10 includes a load switch circuit 11, a lamp lighting circuit 12, a motor driving circuit 13, and a heater driving circuit 14. The lamp lighting circuit 12, the motor driving circuit 13, and the heater driving circuit 14 configure a load circuit 15. The chromatography detector 10 further includes a lamp 16, a stepper motor 17, a DC heater 18, a flow cell 19, an optical detector 20, and a detector controller 30.

The power supply circuit 60 converts AC power into DC power, and generates DC power supply voltage Vcc. The power supply voltage Vcc is, for example, 24 V, but is not limited to 24 V. The load switch circuit 11 is connected to between the power supply circuit 60 and the load circuit 15. The load switch circuit 11 turns on and off the supply of DC power from the power supply circuit 60 to the load circuit 15. In the embodiment, the lamp lighting circuit 12, the motor driving circuit 13, and the heater driving circuit 14 are connected to the load switch circuit 11.

The lamp lighting circuit 12 lights the lamp 16 on the basis of the DC power supplied through the load switch circuit 11. The motor driving circuit 13 drives the stepper motor 17 on the basis of the DC power supplied through the load switch circuit 11. The heater driving circuit 14 drives the DC heater 18 on the basis of the DC power supplied through the load switch circuit 11. The lamp lighting circuit 12, the motor driving circuit 13, and the heater driving circuit 14 include a relatively large capacitive component. The lamp 16 is, for example, a deuterium lamp and a tungsten lamp. The stepper motor 17 moves a shutter and a filter that are placed between the lamp 16 and the flow cell 19. The DC heater 18 adjusts the temperature of an optical system including the flow cell 19.

A mobile phase and a sample that are supplied from an analytical column 140 of FIG. 8 described below flow through the flow cell 19. Light generated by the lamp 16 is guided to the flow cell 19. The optical detector 20 detects light that has passed through the flow cell 19. The detector controller 30 controls the operation of the load switch circuit 11, the lamp lighting circuit 12, the motor driving circuit 13, and the heater driving circuit 14, and receives an output signal of the optical detector 20.

(2) Configuration of Load Switch Circuit 11

Figure 2:
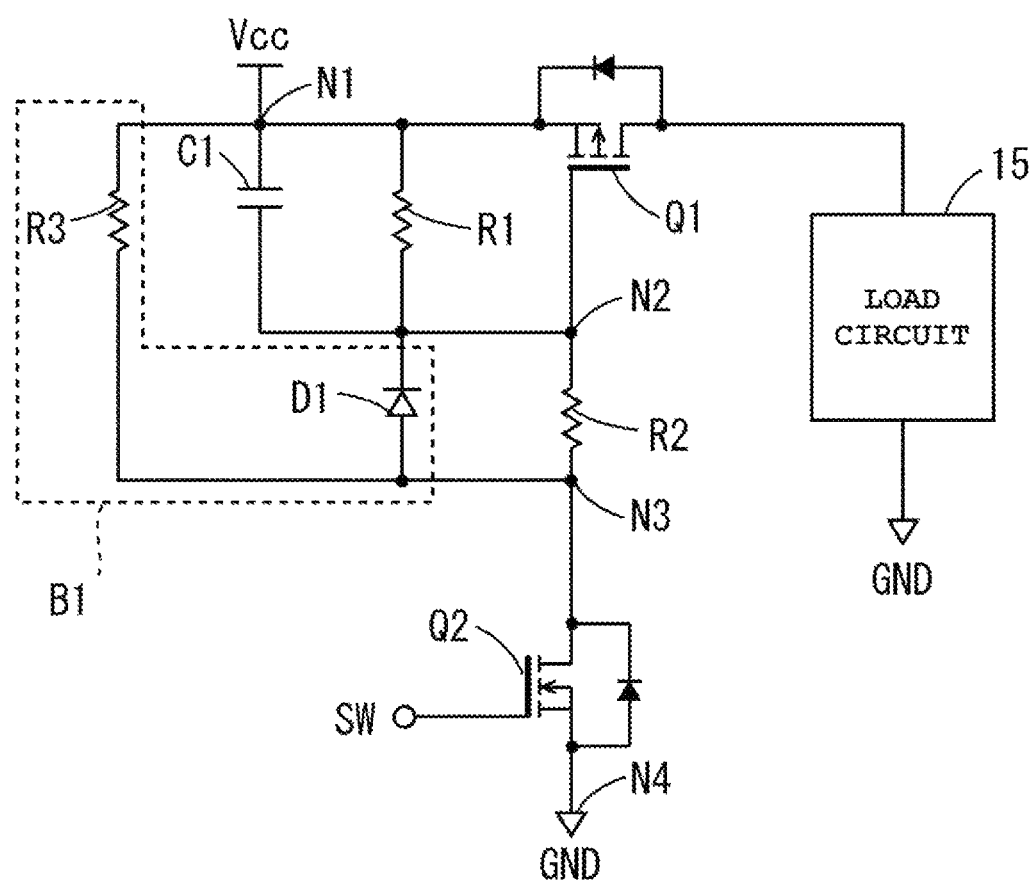
FIG. 2 is a circuit diagram illustrating the configuration of a load switch circuit of FIG. 1.

FIG. 2 is a circuit diagram illustrating the configuration of the load switch circuit 11 of FIG. 1. The load switch circuit 11 includes a p-channel MOSFET (metal-oxide-semiconductor field-effect transistor; hereinafter abbreviated to transistor) Q1, an n-channel MOSFET (metal-oxide-semiconductor field-effect transistor; hereinafter abbreviated to transistor) Q2, a capacitor C1, and resistors R1, R2, and R3.

The transistor Q1 is connected to between a node N1 that receives the power supply voltage Vcc generated by the power supply circuit 60 and the load circuit 15. Specifically, the source of the transistor Q1 is connected to the node N1 and the drain is connected to the load circuit 15, and the gate of the transistor Q1 is connected to a node N2. The capacitor C1 and the resistor R1 are connected in parallel between the nodes N1 and N2. The resistor R2 is connected to between the node N2 and a node N3. The transistor Q2 is connected to between the node N3 and a node N4 that receives ground potential GND. Specifically, the source of the transistor Q2 is connected to the node N4, and the drain is connected to the node N3. A switching signal SW is provided to the gate of the transistor Q2 by the detector controller 30 of FIG. 1.

The resistor R3 is connected to between the nodes N1 and N3. A diode D1 is connected to between the nodes N2 and N3. Specifically, the anode of the diode D1 is connected to the node N3, and the cathode is connected to the node N2. The diode D1 and the resistor R3 configure a bypass circuit B1. In the embodiment, the bypass circuit B1 is a one-way continuity circuit that passes current from the node N1 to the node N2 through the node N3.

When the switching signal SW is changed to the high level, the transistor Q2 is turned on. Consequently, the potential of the node N2 decreases. When a voltage between the nodes N1 and N2 exceeds a gate threshold voltage, the transistor Q1 is turned on. Consequently, the DC power from the power supply circuit 60 is supplied to the load circuit 15. The resistors R1 and R2 limit the drain current of the transistor Q2 and also determine the gate voltage of the transistor Q1. The capacitor C1 has a relatively large time constant. Hence, the rising edge waveform of the drain voltage of the transistor Q1 is distorted due to the time constant of the capacitor C1. Consequently, inrush current upon the turn-off of the transistor Q1 is reduced.

When the switching signal SW is changed to the low level, the transistor Q2 is turned off. Consequently, the potential of the note N2 increases. When a voltage between the nodes N1 and N2 falls below the gate threshold voltage, the transistor Q1 is turned off. Consequently, the load circuit 15 is cut off from the power supply circuit 60. In this case, the potential of the node N2 increases through the parallel circuit of the resistor R1 and the capacitor C1 in such a manner as to approach the power supply voltage Vcc of the node N1, and the potential of the node N2 increases through the resistor R3 and the diode D1 in such a manner as to approach the power supply voltage Vcc. The time constant of the bypass circuit B1 including the resistor R3 and the diode D1 is close to zero. Accordingly, the gate of the transistor Q1 is quickly charged. Hence, the turn-off time of the transistor Q1 is reduced. As a result, heat generation due to the generation of the source-drain voltage of the transistor Q1 is reduced when the transistor Q1 is turned off.

When the transistor Q1 is turned on, reverse bias is applied to the diode D1. Accordingly, the diode D1 is off. Hence, the influence of the diode D1 and the resistor R3 on the turn-on speed can be ignored.

When the transistors Q1 and Q2 are on, current flows through the resistor R3. Accordingly, a power loss occurs. On the other hand, the time constant of the bypass circuit B1 can be ignored when the transistor Q1 is turned off. Accordingly, the value of the resistor R3 hardly influences the turn-off time. Therefore, the value of the resistor R3 can be set to be high in such a manner that the power loss produced by the resistor R3 falls within an allowable range.

Figure 3:
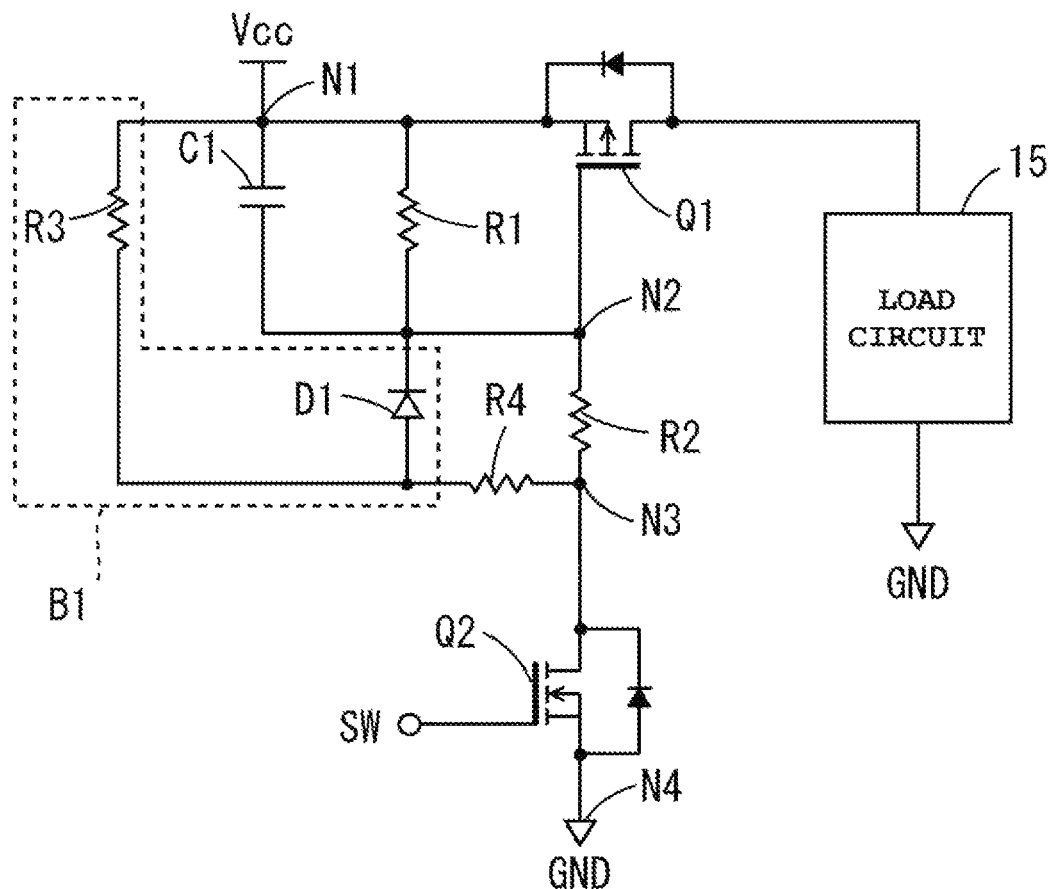
FIG. 3 is a circuit diagram illustrating another example of the load switch circuit.

FIG. 3 is a circuit diagram illustrating another example of the load switch circuit 11. If the capacitance between terminals of the diode D1 is large, the inrush current may flow into the transistor Q2 from the node N1 through the capacitor C1 and the diode D1 when the transistor Q1 is turned on. Hence, it is desirable that the capacitance between the terminals of the diode D1 be small. In the example of FIG. 3, a resistor R4 for current limitation is added to between the anode of the diode D1 and the resistor R2. Consequently, even if the capacitance between the terminals of the diode D1 is large, the inrush current flowing into the transistor Q2 is reduced.

(3) Simulations

Figure 4:
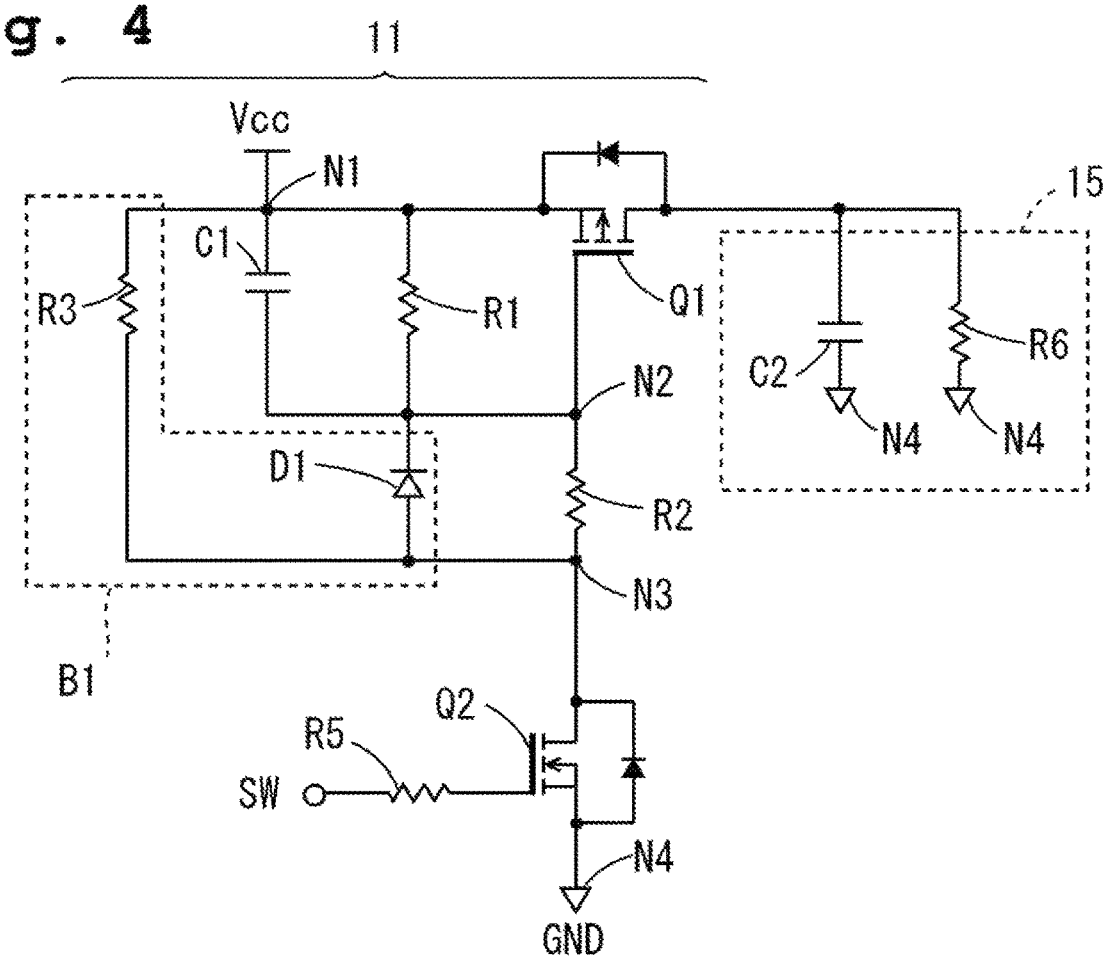
FIG. 4 is a circuit diagram illustrating the configuration of a load switch circuit of an example.
Figure 5:
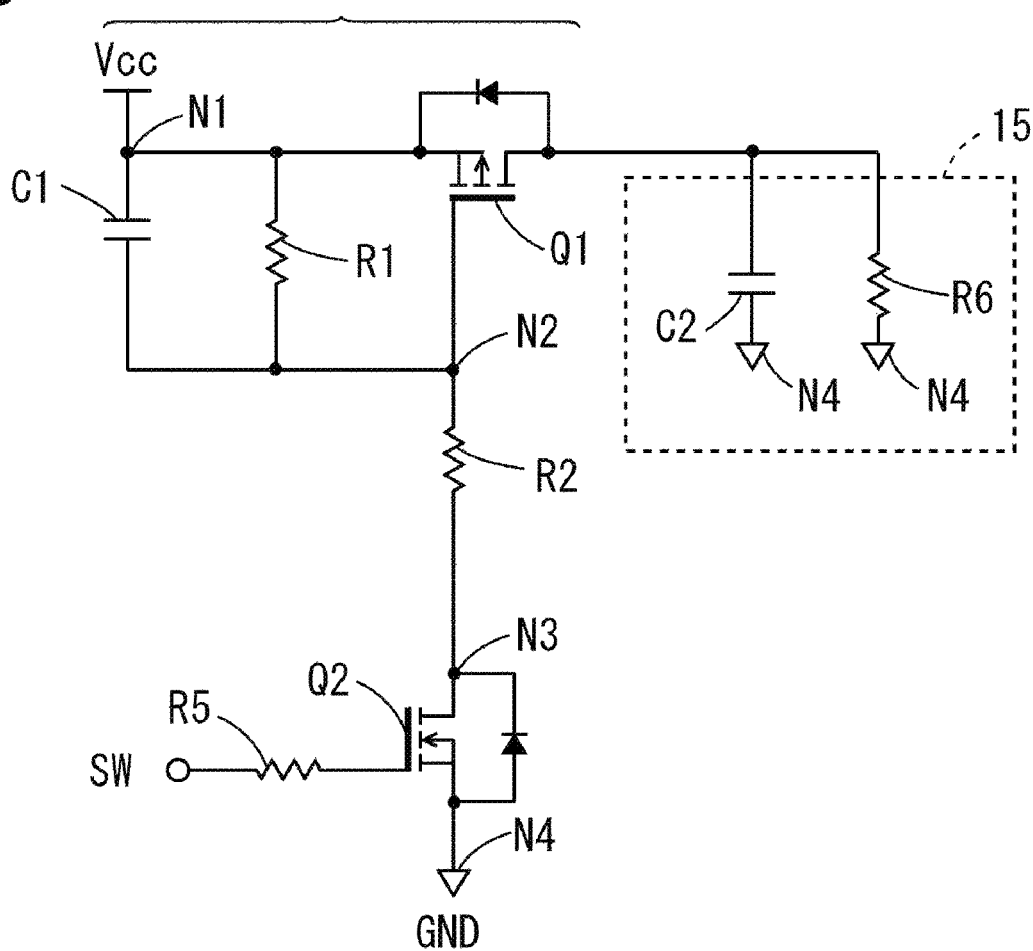
FIG. 5 is a circuit diagram illustrating the configuration of a load switch circuit of a comparative example.

Simulations of the load switch circuits 11 of an example and a comparative example were carried out to evaluate the effects of the load switch circuit 11 according to the embodiment. FIG. 4 is a circuit diagram illustrating the configuration of a load switch circuit of the example. FIG. 5 is a circuit diagram illustrating the configuration of a load switch circuit of the comparative example.

The load switch circuit 11 of the example of FIG. 4 has the same configuration as the load switch circuit 11 according to the embodiment of FIG. 2, except the following points: In the load switch circuit 11 of FIG. 4, the switching signal SW is provided to the gate of the transistor Q2 through a resistor R5; a capacitor C2 and a resistor R6 are used as the laded circuit 15; and the capacitor C2 and the resistor R6 are connected in parallel between the drain of the transistor Q1 and the node N4.

A load switch circuit 11a of the comparative example of FIG. 5 does not include the bypass circuit B1 of FIG. 4. The configuration of the other part of the load switch circuit 11aof the comparative example is similar to the configuration of the load switch circuit 11 of the example of FIG. 4.

In the simulations, the power supply voltage Vcc is 24 V. The capacitance value of the capacitor C1 is 4.7 μF. The value of each of the resistors R1 and R2 is 100 kΩ. The value of the resistor R3 is 10 kΩ. The value of the resistor R5 is 1 kΩ. The capacitance value of the capacitor C2 of the load circuit 15 is 300 μF. The value of the resistor R6 is 6Ω.

Figure 6:
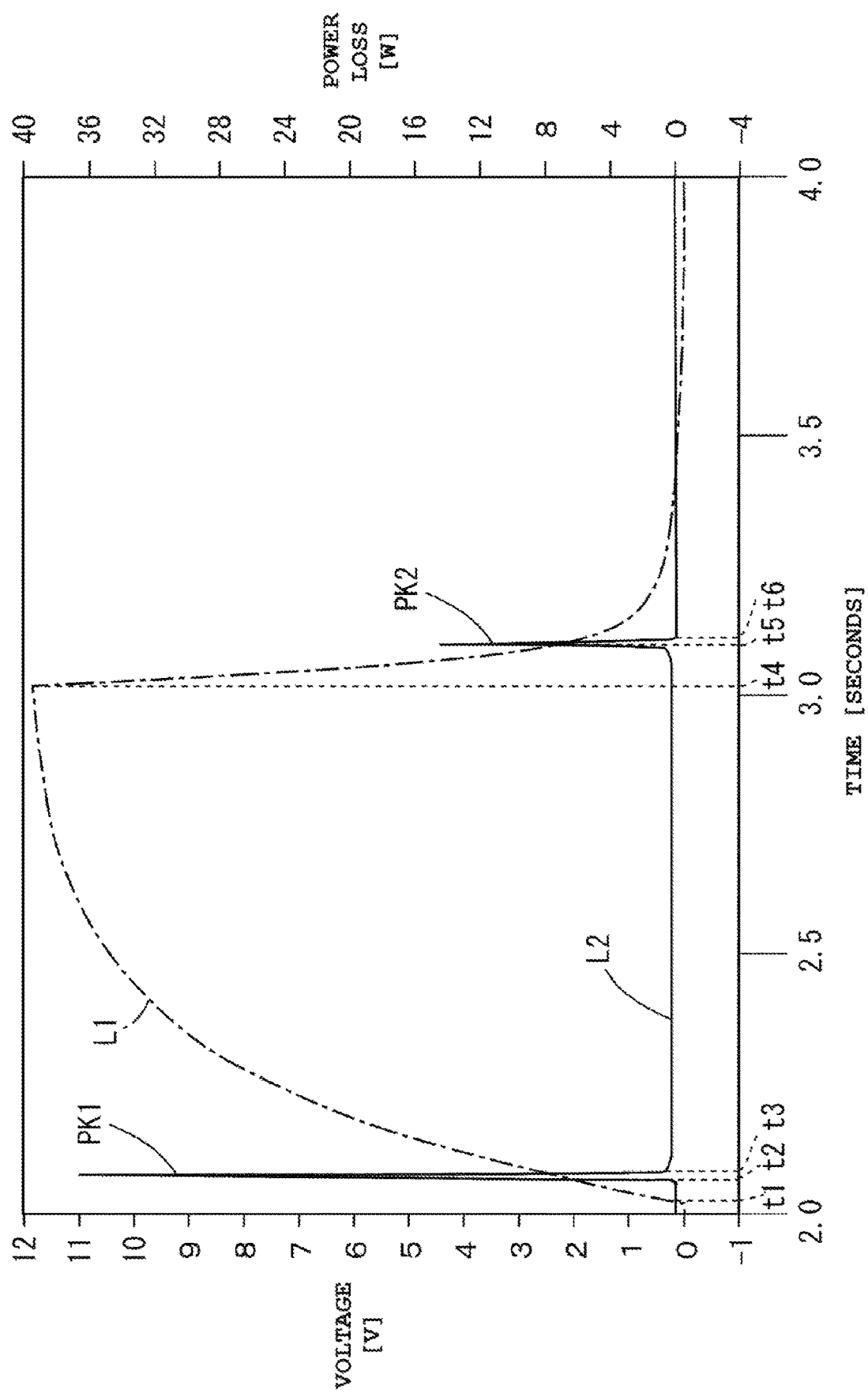
FIG. 6 is a waveform diagram illustrating a simulation result of the load switch circuit of the example.
Figure 7:
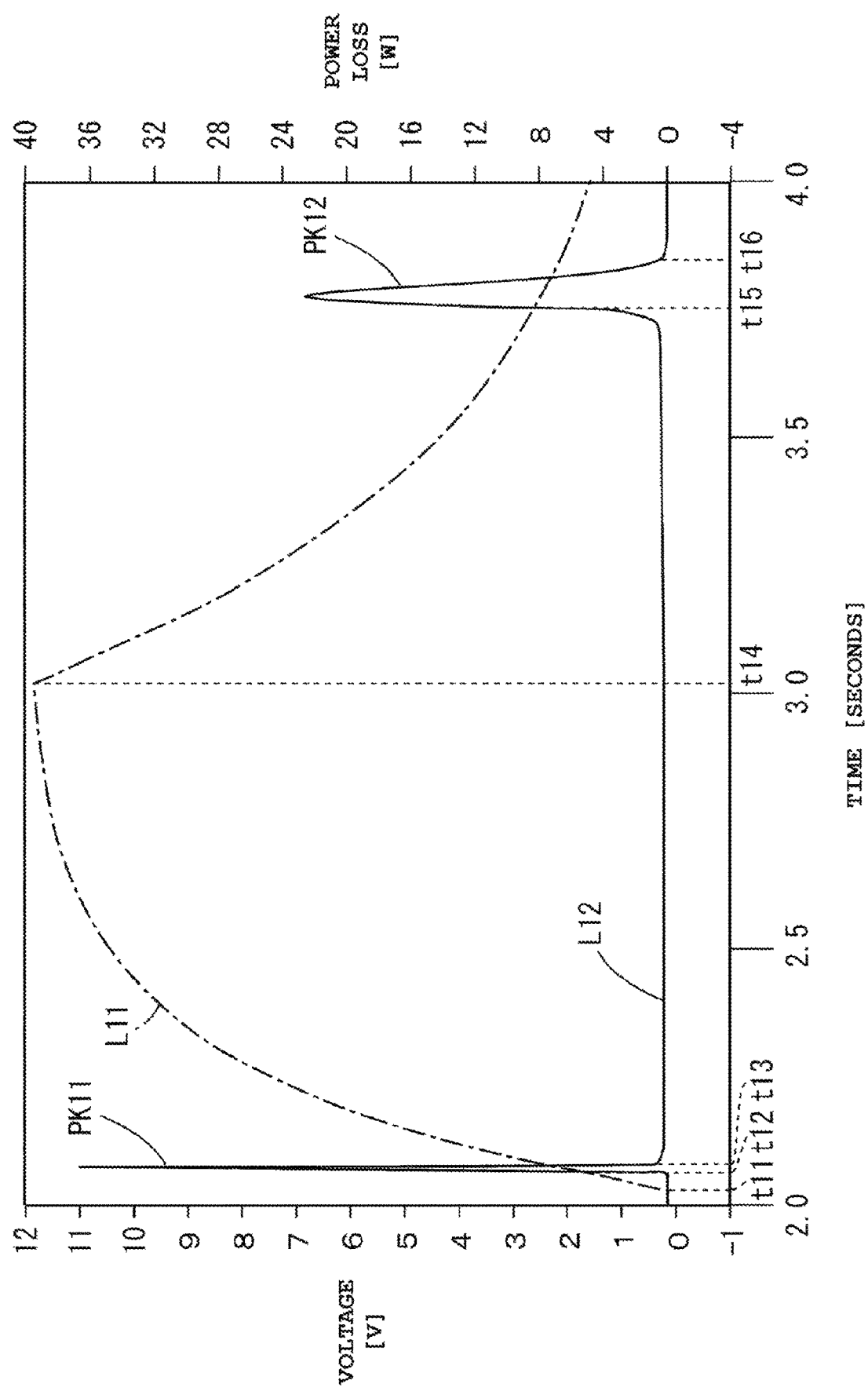
FIG. 7 is a waveform diagram illustrating a simulation result of the load switch circuit of the comparative example.

FIG. 6 is a waveform diagram illustrating a simulation result of the load switch circuit 11 of the example. FIG. 7 is a waveform diagram illustrating a simulation result of the load switch circuit 11a of the comparative example.

In FIGS. 6 and 7, the horizontal axis indicates the time, the left vertical axis indicates the voltage, and the right vertical axis indicates the power loss. The waveform of the gate-source voltage of the transistor Q1 is indicated by dot-and-dash lines L1 and L11. Moreover, the waveform of the power loss of the transistor Q1 is indicated by solid lines L2 and L12.

As illustrated in FIG. 6, when the switching signal SW rises to the high level at time tl in the load switch circuit 11 of the example, the gate-source voltage of the transistor Q1 increases in a logarithmic function manner. The turn-on of the transistor Q1 starts at time t2. The transistor Q1 enters a completely on-state at time t3. A peak PK1 of the power loss mainly due to the inrush current appears during a turn-on period from the start of the turn-on of the transistor Q1 to the completely on-state.

Moreover, when the switching signal SW falls to the low level at time t4, the gate-source voltage of the transistor Q1 decreases exponentially. In this case, the potential of the gate of the transistor Q1 approaches the power supply voltage Vcc quickly through the bypass circuit B1. Accordingly, the gate-source voltage of the transistor Q1 decreases quickly. The transistor Q1 starts turning itself off at time t5. The transistor Q1 enters a completely off-state at time t6. A peak PK2 of the power loss mainly due to transient current flowing through the resistor R6 appears during the turn-off period from the start of the turn-off of the transistor Q1 to the completely off-state.

As illustrated in FIG. 7, when the switching signal SW rises to the high level at time tll in the load switch circuit 11a of the comparative example, the gate-source voltage of the transistor Q1 increases in a logarithmic function manner. The turn-on of the transistor Q1 starts at time t12. The transistor Q1 enters the completely on-state at time t13. A peak PK11 of the power loss mainly due to the inrush current appears during the turn-on period from the start of the turn-on of the transistor Q1 to the completely on-state.

Moreover, when the switching signal SW falls to the low level at time t14, the gate-source voltage of the transistor Q1 decreases exponentially. In this case, the potential of the gate of the transistor Q1 increases gently due to the time constant of the capacitor C1. Accordingly, the gate-source voltage of the transistor Q1 decreases gently. The transistor Q1 starts turning itself off at time t15. The transistor Q1 enters the completely off-state at time t16. A peak PKl2 of the power loss mainly due to the transient current flowing through the resistor R6 appears during the turn-off period from the start of the turn-off of the transistor Q1 to the completely off-state.

As described above, the turn-off time of the transistor Q1 in the load switch circuit 11 of the example is shorter than the turn-off time of the transistor Q1 in the load switch circuit 11a of the comparative example. Hence, the transient current flowing through the transistor Q1 upon the turn-off in the load switch circuit 11 of the example is less than the transient current flowing through the transistor Q1 upon the turn-off in the load switch circuit 11a of the comparative example.

On the other hand, the turn-on time of the transistor Q1 in the load switch circuit 11 of the example is substantially equal to the turn-on time of the transistor Q1 in the load switch circuit 11a of the comparative example. It is clear from this point that there is little influence on the turn-on speed of the transistor Q1 because of the bypass circuit B1 in the load switch circuit 11 of the example.

(4) Chromatograph Apparatus

Figure 8:
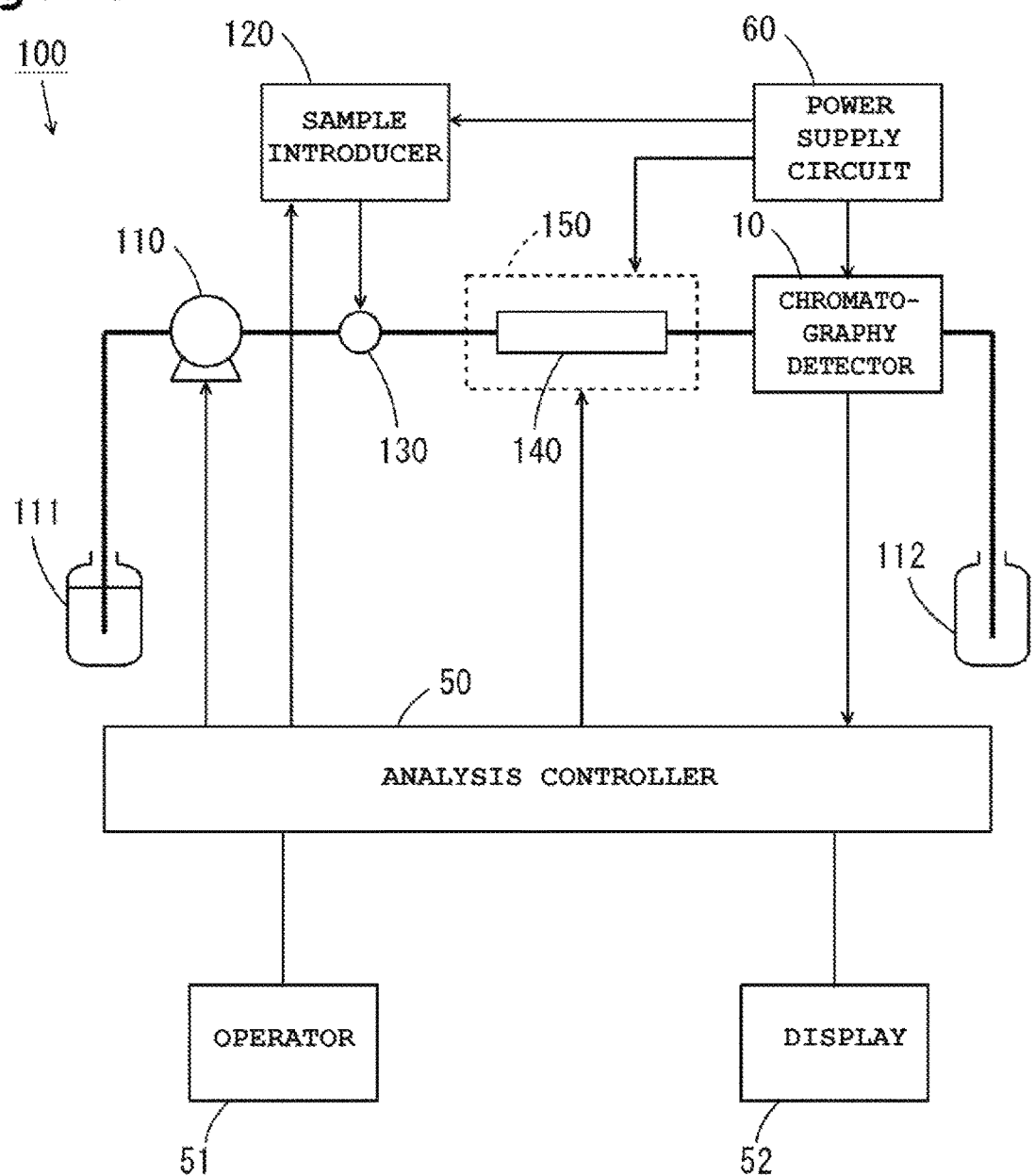
FIG. 8 is a block diagram illustrating the configuration of the chromatograph apparatus including the chromatography detector of FIG. 1.

FIG. 8 is a block diagram illustrating the configuration of a chromatograph apparatus including the chromatography detector 10 of FIG. 1. The chromatograph apparatus 100 of FIG. 8 is a liquid chromatograph apparatus.

The chromatograph apparatus 100 of FIG. 8 includes a mobile phase pump 110, a sample introducer 120, an introduction port 130, the analytical column 140, a column oven 150, and the chromatography detector 10. The analytical column 140 is provided in the column oven 150. The column oven 150 maintains the analytical column 140 at a set temperature.

The pump 110 suctions a mobile phase (solution) in a mobile phase container 111, and supplies it to the analytical column 140. The sample introducer 120 includes, for example, an autosampler or injector, and introduces a sample being an analysis target into the mobile phase in the introduction port 130. The mobile phase and the sample, which have passed through the analytical column 140, flow through the flow cell 19 (FIG. 1) of the chromatography detector 10, and are discharged into a waste container 112.

The chromatograph apparatus 100 includes an analysis controller 50, an operator 51, and a display 52. The operator 51 is used for allowing a user to give various commands to the analysis controller 50. The analysis controller 50 controls the pump 110, the sample introducer 120, the column oven 150, and the chromatography detector 10. Moreover, the analysis controller 50 generates a chromatogram on the basis of an output signal of the chromatography detector 10. The generated chromatogram is displayed on the display 52.

(5) Effects of Embodiment

In the load switch circuit 11 used in the chromatograph apparatus 100 according to the embodiment, it is possible to ensure the turn-on time of the transistor Q1 and reduce the turn-off time of the transistor Q1. Consequently, it is possible to reduce the inrush current and reduce the amount of heat generated upon turn-off. Hence, the transistor Q1 having small rated current capacity can be used. Accordingly, the cost and dimensions of the transistor Q1 can be reduced. Moreover, the resistor R3 and the diode D1 are inexpensive as compared to the transistor Q1. Therefore, it becomes possible to reduce the component cost and the component size of the load switch circuit 11. Moreover, the component costs of the chromatography detector 10 and the chromatograph apparatus 100 using the chromatography detector 10 can be reduced.

(6) Other Embodiments (6-1)

In the above embodiment, the load circuit 15 includes the lamp lighting circuit 12, the motor driving circuit 13, and the heater driving circuit 14. However, the load circuit 15 may include part of the lamp lighting circuit 12, the motor driving circuit 13, and the heater driving circuit 14.

(6-2)

In the above embodiment, the load switch circuit 11 is connected to the load circuit 15 in the chromatography detector 10. However, the load switch circuit 11 may be connected to another operating section of the chromatograph apparatus 100. For example, the load switch circuit 11 may be connected to, for example, a motor driving circuit in the sample introducer 120 or a heater driving circuit in the column oven 150.

(6-3)

In the load switch circuit 11 of the above embodiment, another circuit element such as a resistor may be provided between the source of the transistor Q1 and the node N1. Moreover, another circuit element such as a resistor may be provided between the drain of the transistor Q1 and the load circuit 15. The capacitor C1 may be connected to between the nodes N1 and N2 through the other circuit element. The resistor R1 may be connected to between the nodes N1 and N2 through the other circuit element. The resistor R2 may be connected to between the nodes N2 and N3 through the other circuit element. The resistor R3 may be connected to between the nodes N1 and N3 through the other circuit element. The diode D1 may be connected to between the nodes N2 and N3 through the other circuit element. The gate of the transistor Q1 maybe connected to the node N2 through the other circuit element. The transistor Q2 may be connected to between the nodes N3 and N4 through the other circuit element. The resistor R4 may be connected to between the anode of the diode D1 and the node N3 through the other circuit element.

(6-4)

In the above embodiment, the transistors Q1 and Q2 are MOSFETs. However, another type of switching element such a bipolar transistor or IGBT (Insulated Gate Bipolar Transistor) may be used as a first switching element. Another type of switching element such as a bipolar transistor or IGBT may be used as a second switching element.

(6-5)

In the above embodiment, the resistors R1 to R4 are used as first to fourth resistive elements. However, other circuit elements having resistive components as the first to fourth resistive elements may be used. Moreover, in the above embodiment, the capacitor C1 is used as a capacitive element. However, another circuit element having a capacitive component may be used as the capacitive element.

(6-6)

In the above embodiment, the bypass circuit B1 includes the resistor R3 and the diode D1. However, the bypass circuit B1 may include a switching element such as a photocoupler or transistor. In this case, instead of the resistor R3 and the diode D1, the switching element is connected to between the nodes N1 and N2. The switching element is put in the on-state by a control circuit such as the detector controller 30 upon the turn-off of the transistor Q1.

(6-7)

In the above embodiment, the resistors R1 and R2 and the transistor Q2 are provided to change the potential of the gate of the transistor Q1. However, instead of the resistor R2 and the transistor Q2, another gate potential control circuit may be provided.

(6-8)

In the above embodiment, the chromatograph apparatus 100 is a liquid chromatograph apparatus. However, the chromatograph apparatus maybe another chromatograph apparatus such as a supercritical fluid chromatograph apparatus.

(7) Correspondences Between Constituent Elements of Claims and Elements of Embodiment Examples of correspondences between constituent elements of the claims and elements of the embodiment are described below. In the above embodiment, the lamp lighting circuit 12, the motor driving circuit 13, or the heater driving circuit 14 is an example of an operating section. The transistor Q1 is an example of a first switching element. The gate is an example of a control terminal. The capacitor C1 is an example of a capacitive element. The resistor R1 is an example of a first resistive element. The resistor R2 is an example of a second resistive element. The resistor R3 is an example of a third resistive element. The resistor R4 is an example of a fourth resistive element. The transistor Q2 is an example of a second switching element. The power supply voltage Vcc is an example of DC voltage. The ground potential GND is an example of a reference potential. The nodes N1 to N4 are examples of first to fourth nodes. In the above embodiment, various other elements having configurations or functions described in the claims can also be used as the constituent elements of the claims.

(8) Aspects

Those skilled in the art understand that a plurality of the above-mentioned illustrative embodiments is specific examples of the following aspects:

(Section 1)

According to section 1 of a chromatograph apparatus, when a first switching element in a load switch circuit is turned on, electricity conducts between a first node that receives DC voltage and a load circuit. Consequently, the supply of DC power to the load circuit is turned on. In this case, the waveform of a voltage provided to the load circuit is distorted due to the time constant of a capacitive element. Consequently, inrush current upon the turn-on of the first switching element is reduced.

When a second switching element is turned off, the first node that receives the DC voltage and the load circuit are cut off. Consequently, the supply of the DC power to the load circuit is turned off. At this point in time, a bypass circuit passes current between the first node and a second node. Consequently, the potential of a control terminal of the first switching element changes quickly. Hence, the turn-off time of the first switching element is reduced. Therefore, heat generation of the first switching element upon the turn-off of the first switching element is reduced. Accordingly, large rated current capacity is not required of the first switching element. Consequently, the cost of the first switching element can be reduced.

As a result, it becomes possible to reduce inrush current and reduce heat generation of a component at low cost in a load switch circuit and the chromatograph apparatus.
(Section 2)

According to section 2 of the chromatograph apparatus, a one-way continuity circuit having a simple configuration allows quickly changing the potential of the control terminal of the first switching element upon the turn-off without influencing the operation of the first switching element upon the turn-on.
(Section 3)

According to section 3 of the chromatograph apparatus, current can be passed from the first node to the second node upon the turn-off with a simple configuration.
(Section 4)

According to section 4 of the chromatograph apparatus, the first switching element is turned on or off in response to the turn-on or -off of the second switching element. Also if the inrush current flows from the first node through the capacitive element and a diode upon the turn-on of the first switching element, the inrush current flowing into the second switching element is reduced by a fourth resistive element. Consequently, large rated current capacity is not required of the second switching element. As a result, the component cost and the component size can be reduced.
(Section 5)
(Section 6)

According to section 6 of a load switch circuit, when a first switching element is turned on, electricity conducts between a first node that receives DC voltage and a load circuit. Consequently, the supply of DC power to the load circuit is turned on. In this case, the waveform of a voltage provided to the load circuit distorted due to the time constant of a capacitive element. Consequently, inrush current upon the turn-on of the first switching element is reduced.

When a second switching element is turned off, the first node that receives the DC voltage and the load circuit are cut off. Consequently, the supply of the DC power to the load circuit is turned off. At this point in time, a bypass circuit passes current between the first node and a second node. Consequently, the potential of a control terminal of the first switching element changes quickly. Hence, the turn-off time of the first switching element is reduced. Therefore, heat generation of the first switching element upon the turn-off of the first switching element is reduced. Accordingly, large rated current capacity is not required of the first switching element. Consequently, the cost of the first switching element can be reduced.

As a result, it becomes possible to reduce inrush current and reduce heat generation of a component at low cost in the load switch circuit.

What is claimed is:

1. A chromatograph apparatus comprising:
a plurality of operating sections configuring a chromatograph; and
a load switch circuit configured to turn on and off supply of DC power, wherein
at least one of the plurality of operating sections is connected as a load circuit to the load switch circuit, and
the load switch circuit includes
a first switching element connected between a first node that receives DC voltage and the load circuit, the first switching element having a control terminal that receives a potential of a second node,
a capacitive element connected between the first and second nodes,
a first resistive element connected between the first and second nodes, and
a bypass circuit configured to pass current between the first and second nodes upon turn-off of the first switching element.

2. The chromatograph apparatus according to claim 1, wherein the bypass circuit includes a one-way continuity circuit configured to pass current from the first node to the second node upon the turn-off of the first switching element.

3. The chromatograph apparatus according to claim 2, wherein
the load switch circuit further includes a second resistive element connected between the second node and a third node, and
the one-way continuity circuit includes
a third resistive element connected between the first and third nodes, and
a diode connected between the third and second nodes.

4. The chromatograph apparatus according to claim 3, wherein the load switch circuit further includes
a second switching element connected between the third node and a fourth node set at a reference potential, and
a fourth resistive element connected between an anode of the diode and the second node.

5. The chromatograph apparatus according to claim 1, wherein
the chromatograph includes
an analytical column,
a detector configured to detect constituents of a sample separated by the analytical column, and
a power supply circuit,
the detector includes the load switch circuit and the load circuit, and
the load switch circuit is connected between the power supply circuit and the load circuit.

6. The chromatograph apparatus according to claim 5, wherein
the load circuit includes a lamp lighting circuit, a motor driving circuit, or a heater driving circuit.

7. A load switch circuit for turning on and off supply of DC power to a load circuit of a chromatograph apparatus, the load switch circuit comprising:
a first switching element connected between a first node that receives DC voltage and the load circuit, the first switching element including a control terminal that receives a potential of a second node;
a capacitive element connected between the first and second nodes;

a first resistive element connected between the first and second nodes; and a bypass circuit configured to pass current between the first and second nodes upon turn-off of the first switching element.

8. The load switch circuit according to claim 7, wherein the bypass circuit includes a one-way continuity circuit configured to pass current from the first node to the second node upon the turn-off of the first switching element.

9. The load switch circuit according to claim 8, wherein
the load switch circuit further includes a second resistive element connected between the second node and a third node, and
the one-way continuity circuit includes
a third resistive element connected between the first and third nodes, and
a diode connected between the third and second nodes.

10. The load switch circuit according to claim 9, wherein the load switch circuit further includes
a second switching element connected between the third node and a fourth node set at a reference potential, and
a fourth resistive element connected between an anode of the diode and the second node.

* * * * *